United States Patent
Tae et al.

(10) Patent No.: US 8,307,223 B2
(45) Date of Patent: Nov. 6, 2012

(54) BATTERY MANAGEMENT SYSTEM AND DRIVING METHOD THEREOF

(75) Inventors: Yongjun Tae, Suwon-si (KR); Yusai Murakami, Suwon-si (KR)

(73) Assignee: SB LiMotive Co., Ltd., Yongin-si (KR)

( * ) Notice: Subject to any disclaimer, the term of this patent is extended or adjusted under 35 U.S.C. 154(b) by 335 days.

(21) Appl. No.: 12/629,866

(22) Filed: Dec. 2, 2009

(65) Prior Publication Data

US 2010/0295382 A1 Nov. 25, 2010

(30) Foreign Application Priority Data

May 19, 2009 (KR) ........................ 10-2009-0043547

(51) Int. Cl.
*G06F 1/00* (2006.01)
(52) U.S. Cl. ........................ 713/300; 713/320
(58) Field of Classification Search .................. 713/300, 713/320; 320/137
See application file for complete search history.

(56) References Cited

U.S. PATENT DOCUMENTS

| | | | | |
|---|---|---|---|---|
| 5,870,025 | A * | 2/1999 | Hinohara | 340/636.12 |
| 6,768,286 | B2 * | 7/2004 | Trembley | 320/117 |
| 6,976,184 | B2 * | 12/2005 | Hartwell | 713/500 |
| 7,085,948 | B2 | 8/2006 | Anderson et al. | |
| 7,619,449 | B2 * | 11/2009 | Lee | 327/141 |
| 2006/0214627 | A1 * | 9/2006 | Ito et al. | 320/107 |
| 2007/0090793 | A1 * | 4/2007 | Eguchi et al. | 320/112 |
| 2007/0139006 | A1 | 6/2007 | Yasuhito et al. | |
| 2008/0086247 | A1 | 4/2008 | Gu et al. | |
| 2008/0129247 | A1 | 6/2008 | Lee et al. | |
| 2008/0201597 | A1 * | 8/2008 | Chong et al. | 713/401 |
| 2010/0244770 | A1 | 9/2010 | Yasuhito et al. | |
| 2010/0244771 | A1 | 9/2010 | Yasuhito et al. | |

FOREIGN PATENT DOCUMENTS

| | | |
|---|---|---|
| EP | 1 770 667 A2 | 4/2007 |
| EP | 1 967 408 A2 | 9/2008 |
| JP | 2000-270492 | 9/2000 |
| JP | 2000-294298 | 10/2000 |
| JP | 2002-374633 | 12/2002 |
| JP | 2003-017134 | 1/2003 |
| JP | 2008-048027 | 2/2008 |
| JP | 2008-099538 | 4/2008 |
| JP | 2008-177774 | 7/2008 |
| JP | 2008-220074 | 9/2008 |
| JP | 2008-245271 | 10/2008 |

(Continued)

OTHER PUBLICATIONS

European Office Action dated May 17, 2011, issued by the EPO for corresponding Patent Application 10 163 238.8, 4 pages.

(Continued)

*Primary Examiner* — Thomas Lee
*Assistant Examiner* — Xuxing Chen
(74) *Attorney, Agent, or Firm* — Christie, Parker & Hale, LLP

(57) ABSTRACT

A battery management system includes at least one slave battery management system and a master battery management system. The slave battery management system outputs a ready signal when power is applied thereto, and the master battery management system provides a synchronization start signal to the slave battery management system in response to the ready signal. The master battery management system periodically provides a synchronization reset signal to the slave battery management system.

17 Claims, 8 Drawing Sheets

FOREIGN PATENT DOCUMENTS

| KR | 10-2006-0073525 | 6/2006 |
|---|---|---|
| KR | 10-0626896 | 9/2006 |
| KR | 10-2007-0064244 | 6/2007 |

OTHER PUBLICATIONS

European Search Report dated Aug. 13, 2010, for corresponding European Patent application 10163238.8.

KIPO Notice of Allowance dated Jan. 19, 2011, for Korean priority Patent application 10-2009-0043547.

Patent Abstracts of Japan and English machine translation of Japanese Publication 2008-048027, 15 pages.

Korean Patent Abstracts, Publication No. 1020020004945, dated Jan. 16, 2002, corresponding to Korean Patent 10-0626896.

Japanese Office action dated Nov. 8, 2011, for corresponding Japanese Patent application 2009-267627, 3 pages.

Patent Abstracts of Japan, and English machine translation of Japanese Publication 2000-270492, 7 pages.

Patent Abstracts of Japan, and English machine translation of Japanese Publication 2000-294298, 10 pages.

Patent Abstracts of Japan, and English machine translation of Japanese Publication 2002-374633, 13 pages.

Patent Abstracts of Japan, and English machine translation of Japanese Publication 2003-017134, 17 pages.

Patent Abstracts of Japan, and English machine translation of Japanese Publication 2008-177774, 19 pages.

Patent Abstracts of Japan, and English machine translation of Japanese Publication 2008-245271, 18 pages.

\* cited by examiner

BATTERY MANAGEMENT SYSTEM AND DRIVING METHOD THEREOF

CROSS-REFERENCE TO RELATED APPLICATION(S)

This applications claims priority to and the benefit of Korean Application No. 10-2009-0043547 filed May 19, 2009 in the Korean Intellectual Property Office, the entire content of which is incorporated by reference herein.

BACKGROUND OF THE INVENTION

1. Field of the Invention

Embodiments of the present invention relate to a battery management system and a method for driving the same.

2. Description of the Related Art

In general, gasoline, diesel oil and liquefied petroleum gas (LPG) are used as vehicle fuel. Vehicles using the petroleum products release harmful exhaust gases that are known to cause not only air pollution but also global warming. In view of the situation, considerable research efforts have been made in the related art to develop hybrid electric vehicles (HEVs) and electric vehicles (EVs). HEVs release less amount of harmful exhaust gases and EVs do not release any harmful exhaust gases.

HEVs are driven by not only a gasoline-, diesel- or LPG-fueled internal combustion engine but also electricity supplied by a battery. The operation of HEVs is controlled so as to reach a maximum fuel efficiency in response to situations encountered during driving.

A motor generator mounted in an HEV is converted from a power mode to an electricity generation mode under the control of a motor control unit (MTCU) during braking or deceleration. A battery used in the HEV can be charged by electrical energy generated from the motor generator under the control of a battery management system (BMS) connected to the MTCU.

The number of battery cells in a battery of an HEV is gradually increasing in order to improve the performance of the HEV. Thus, it is desirable to provide a battery management system that is capable of efficiently managing a large number of battery cells.

SUMMARY OF THE INVENTION

An embodiment of the present invention provides a battery management system which includes at least one slave battery management system for outputting a ready signal when power is applied thereto, and a master battery management system for providing a synchronization start signal to the at least one slave battery management system in response to the ready signal, wherein the master battery management system is configured to periodically provide a synchronization reset signal to the at least one slave battery management system.

Another embodiment of the present invention provides a method for driving a battery management system including a master battery management system and at least one slave battery management system, the method including determining whether the master battery management system receives a ready signal from the at least one slave battery management system, providing a synchronization start signal from the master battery management system to the at least one slave battery management system in response to the ready signal, and periodically providing a synchronization reset signal from the master battery management system to the at least one slave battery management system.

DETAILED DESCRIPTION OF EMBODIMENTS

Now, embodiments of the present invention will be described in more detail with reference to the accompanying drawings.

Figure 1:
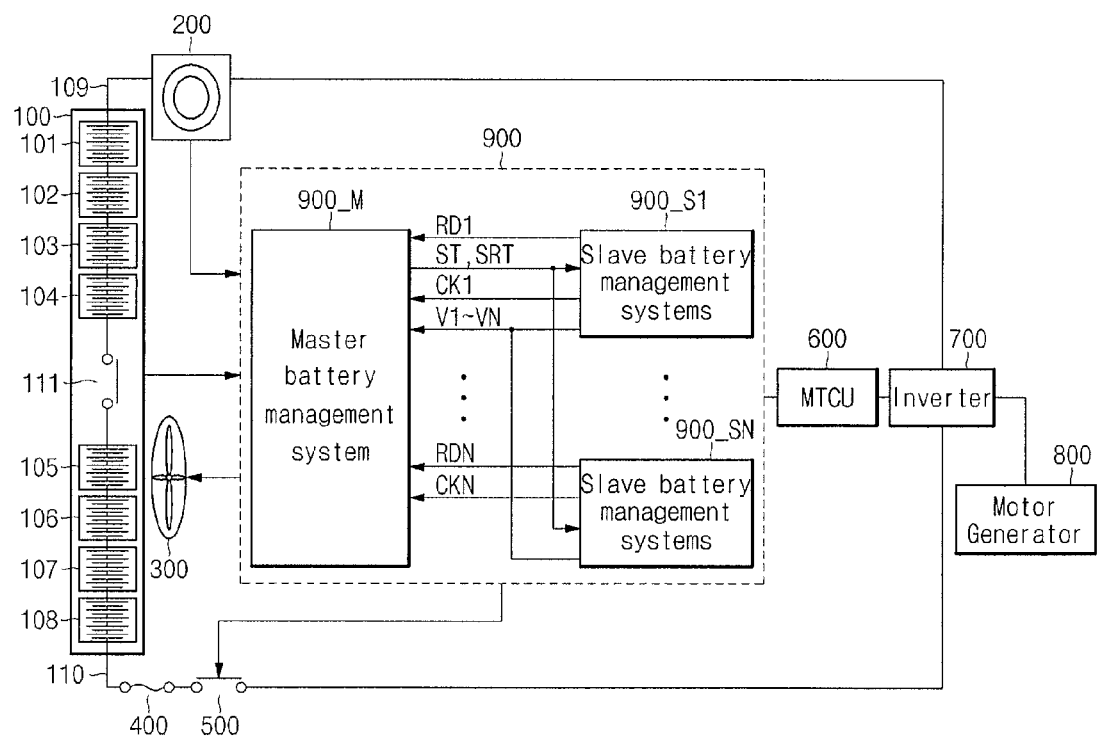
FIG. 1 is a schematic block diagram of a battery management system according to an embodiment of the present invention and its peripheral devices.

FIG. 1 is a schematic block diagram of a battery management system 900 according to an embodiment of the present invention and its peripheral devices.

As illustrated in FIG. 1, the battery management system 900 includes a master battery management system 900_M and a plurality of slave battery management systems 900_S1 to 900_SN. The peripheral devices are a battery 100, a current sensor 200, a cooling fan 300, a fuse 400, a master switch 500, a motor control unit (MTCU) 600, an inverter 700, and a motor generator 800.

The battery 100 includes a plurality of sub-packs 101 to 108, each of which includes a plurality of battery cells connected in series with each other, output terminals 109 and 110, and a safety switch 111 positioned between the sub-packs 104 and 105. Although eight sub-packs 101 to 108 are illustrated in FIG. 1, the number of the sub-packs is merely illustrative and batteries in other embodiments may include more or less than eight sub-packs. Further, no limitation is imposed on the number of the battery cells constituting each of the sub-packs 101 to 108. When the battery is replaced with a new one or is repaired, the safety switch 111 can be manually turned on or off in consideration of the safety of an operator. The position of the safety switch 111 is not limited to that shown in FIG. 1. For example, the safety switch 111 may be positioned between any two of the sub-packs 101 to 108.

The current sensor 200 measures the amount of current flowing in the battery 100 and delivers the measured value to the battery management system 900. For example, the current sensor 200 may be a Hall current transformer (CT) that measures a current value using a Hall device and outputs an analog current signal corresponding to the measured value, or may be a shunt resistor that is connected to a wire through which an electric current of the battery flows to generate a voltage signal corresponding to the current of the battery.

The cooling fan 300 dissipates heat generated during charging and discharging of the battery 100. The cooling fan 300 protects the battery 100 from degradation and prevents or reduces the deterioration of charge/discharge efficiency due to heat generated during charge and discharge.

When an overcurrent is inputted to or outputted from the battery 100, the fuse 400 is disconnected (i.e., the fuse is blown) to protect the battery 100.

When an abnormal phenomenon, such as overvoltage, overcurrent or overheating, occurs, the master switch 500 blocks the high-current path of the battery 100 on the basis of (i.e., in response to) a control signal from the battery management system 900 or the MTCU 600.

The MTCU 600 recognizes the current driving status and calculates the required torque on the basis of information, such as an accelerator, a brake and the speed of the vehicle, and controls the delivery direction of power between the battery 100 and the motor generator 800 on the basis of the calculated torque and the state of charge (SOC) of the battery. The current driving status of the vehicle may include key on, key off, a constant-speed drive, an accelerated drive, etc.

The inverter 700 allows the battery 100 to be charged or discharged under the control operation of the MTCU 600. In one embodiment, the MTCU 600 controls the inverter 700 in such a manner that the output of the motor generator 800 matches (i.e., corresponds to or is in accordance with) the calculated torque. Further, the MTCU 600 transmits information regarding the status of the vehicle to the battery management system 900, receives the SOC of the battery 100 from the battery management system 900, and controls the delivery direction of power between the battery 100 and the motor generator 800 so as to allow the SOC of the battery 100 to reach a target value (for example, 55%). For example, when the SOC received from the battery management system 900 is less than 55%, the MTCU 600 controls the inverter 700 so as to allow the power of the motor generator 800 to be delivered to the battery 100. As a result, the battery 100 is charged. At this time, while the battery is being charged, the current of the battery can be defined as a '+' value. Meanwhile, when the SOC is greater than 55%, the MTCU 600 controls the inverter 700 so as to allow the power of the battery 100 to be delivered to the motor generator 800. As a result, the battery 100 is discharged. At this time, while the battery is being discharged, the current of the battery can be defined as a '−' value.

The motor generator 800 drives the vehicle using electrical energy of the battery 100 on the basis of the torque information transmitted from the MTCU 600.

As described above, the battery management system 900 includes a master battery management system 900_M and a plurality of slave battery management systems 900_S1 to 900_SN.

The slave battery management systems 900_S1 to 900_SN essentially measure the voltages (V) of the battery cells assigned thereto, the temperature (T) of the battery, etc., and transmit the measured values to the master battery management system 900_M. The slave battery management systems 900_S1 to 900_SN respectively transmit ready signals RD1 to RDN to the master battery management system 900_M to inform the master battery management system 900_M of their operational states. That is, the operational states of the slave battery management systems 900_S1 to 900_SN include power-on and power-off states. Power-on refers to an operational state in which power is normally supplied to the slave battery management systems 900_S1 to 900_SN, and power-off refers to an abnormal operational state in which power is not supplied to the slave battery management systems 900_S1 to 900_SN. The ready signals RD1 to RDN respectively indicate that the slave battery management systems 900_S1 to 900_SN are in a power-on state. For instance, the ready signals RD1 to RDN may be electrical signals at an active high level. Of course, the ready signals RD1 to RDN are respectively set to an inactive low level when the slave battery management systems 900_S1 to 900_SN are in a power off state.

The master battery management system 900_M also measures the voltages (V) of the battery cells assigned thereto, the current (I) and temperature (T) of the battery, etc. Further, the master battery management system 900_M receives the voltages (V) of the battery cells, the temperature (T) of the battery, etc. from the slave battery management systems 900_S1 to 900_SN and estimates the state of charge (SOC) and state of health (SOH) of the battery as a whole on the basis of the measured values. It should, of course, be understood that the battery cells assigned to the master battery management system 900_M are different from the battery cells assigned to the slave battery management systems 900_S1 to 900_SN.

The master battery management system 900_M controls the charging and discharging of the battery on the basis of the SOC and SOH. When the master battery management system 900_M receives the ready signals RD1 to RDN from all of the slave battery management systems 900_S1 to 900_SN, it determines that all of the slave battery management systems 900_S1 to 900_SN can normally operate and generates a synchronization start signal ST while concurrently operating an internal timer. Also, the master battery management system 900_M transmits the synchronization start signal ST to the slave battery management systems 900_S1 to 900_SN. Then, the slave battery management systems 900_S1 to 900_SN operate respective internal timers in response to the synchronization start signal ST. That is, the master battery management system 900_M operates its internal timer while generating a synchronization start signal ST, and the slave battery management systems 900_S1 to 900_SN also operate their respective internal timers in response to the synchronization start signal ST. Further, the master battery management system 900_M periodically generates a synchronization reset signal SRT and transmits the synchronization reset signal SRT to the slave battery management systems 900_S1 to 900_SN. Then, the slave battery management systems 900_S1 to 900_SN reset their respective internal timers to a reference time (e.g., predetermined time). As a result, the respective internal timers of the slave battery management systems 900_S1 to 900_SN are periodically and forcibly synchronized with the internal timer of the master battery management system 900_M. Further, when the synchronization start signal ST or the synchronization reset signal SRT is inputted, the slave battery management systems 900_S1 to 900_SN output respective synchronization check signals CK1 to CKN to the master battery management system 900_M. Accordingly, the master battery management system 900_M can confirm (or verify) whether or not the slave battery management systems 900_S1 to 900_SN are properly synchronized. More detailed explanation of the constitutions and operations of the master battery management system 900_M and the slave battery management systems 900_S1 to 900_SN will be provided below.

In one embodiment, the master battery management system 900_M includes the same hardware elements as each of the slave battery management systems 900_S1 to 900_SN. However, depending on the states of switches (shown in FIG. 3) included in the master battery management system 900_M and the slave battery management systems 900_S1 to 900_SN and how identifiers are set in the master battery management system 900_M and the slave master battery management systems 900_S1 to 900_SN, different programs may be set in the master battery management system 900_M and the slave battery management systems 900_S1 to 900_SN, thus allowing the battery management system to be operated as either the battery management system 900_M or one of the slave battery management systems 900_S1 to 900_SN. That is, depending on the programs set in the master battery management system 900_M and the slave battery management systems 900_S1 to 900_SN, the battery management system can be operated as either the battery management system 900_M or as one of the slave battery management systems 900_S1 to 900_SN.

Figure 2:
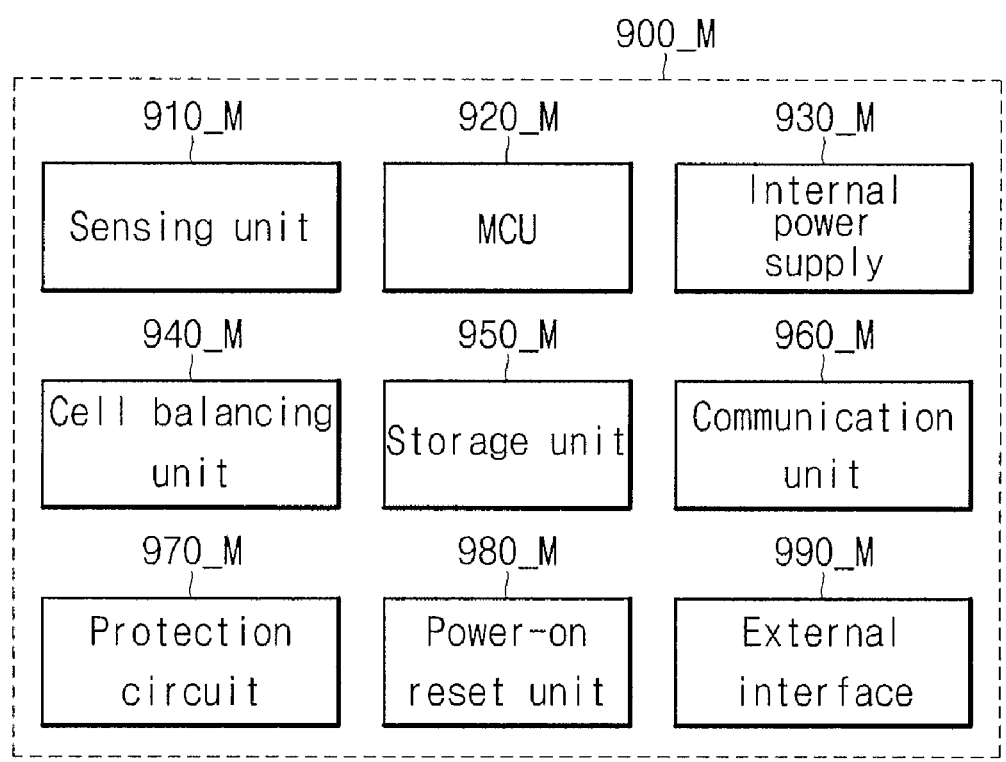
FIG. 2 is a detailed block diagram of a master battery management system of the battery management system according to one embodiment of the present invention.

FIG. 2 is a detailed block diagram illustrating the constitution of the master battery management system 900_M of the battery management system according to one embodiment of the present invention.

As illustrated in FIG. 2, the master battery management system 900_M includes a sensing unit 910_M, a micro control unit (MCU) 920_M, an internal power supply 930_M, a cell balancing unit 940_M, a storage unit 950_M, a communication unit 960_M, a protection circuit 970_M, a power-on reset unit 980_M and an external interface 990_M.

The sensing unit 910_M receives a control signal from the micro control unit (MCU) 920_M and measures the voltages (V) of the battery cells, the current (I) and temperature (T) of the battery, etc. The voltages (V) of the battery cells and the current (I) and temperature (T) of the battery are read as analog values. The sensing unit 910_M converts the analog values to digital data and transmits the digital data to the MCU 920_M.

The MCU 920_M estimates the SOC and SOH of the battery on the basis of the digital data received from the sensing unit 910_M.

The internal power supply 930_M supplies power to the master battery management system 900_M using an auxiliary battery.

The cell balancing unit 940_M balances between the charge and discharge states of the respective battery cells. That is, the cell balancing unit 940_M discharges a battery cell in a relatively high charge state and charges a battery cell in a relatively low charge state.

The storage unit 950_M stores information such as the current SOC and SOH when the master battery management system 900_M is turned off. The storage unit 950_M may be a non-volatile storage device capable of electrically writing or erasing data. For example, the storage unit 950_M may be an electrically erasable programmable read-only memory (EEPROM).

The communication unit 960_M communicates with the MTCU 600 of the vehicle. That is, the communication unit 960_M transmits information regarding the SOC and SOH of the battery to the MTCU 600, or receives information regarding the state of the vehicle from the MTCU 600 and transmits the information to the MCU 920_M.

The protection circuit 970_M protects the battery 100 from overcurrent, overvoltage, etc. using a hardware device, for example.

The power-on reset unit 980_M resets the system as a whole when the master battery management system 900_M is turned on.

The external interface 990_M connects the cooling fan 300 and the master switch 500 to the MCU 920_M.

The constitutions of the slave battery management systems 900_S1 to 900_SN are set to be the same or substantially the same as the master battery management system 900_M, and a detailed explanation thereof is omitted herein.

Figure 3:
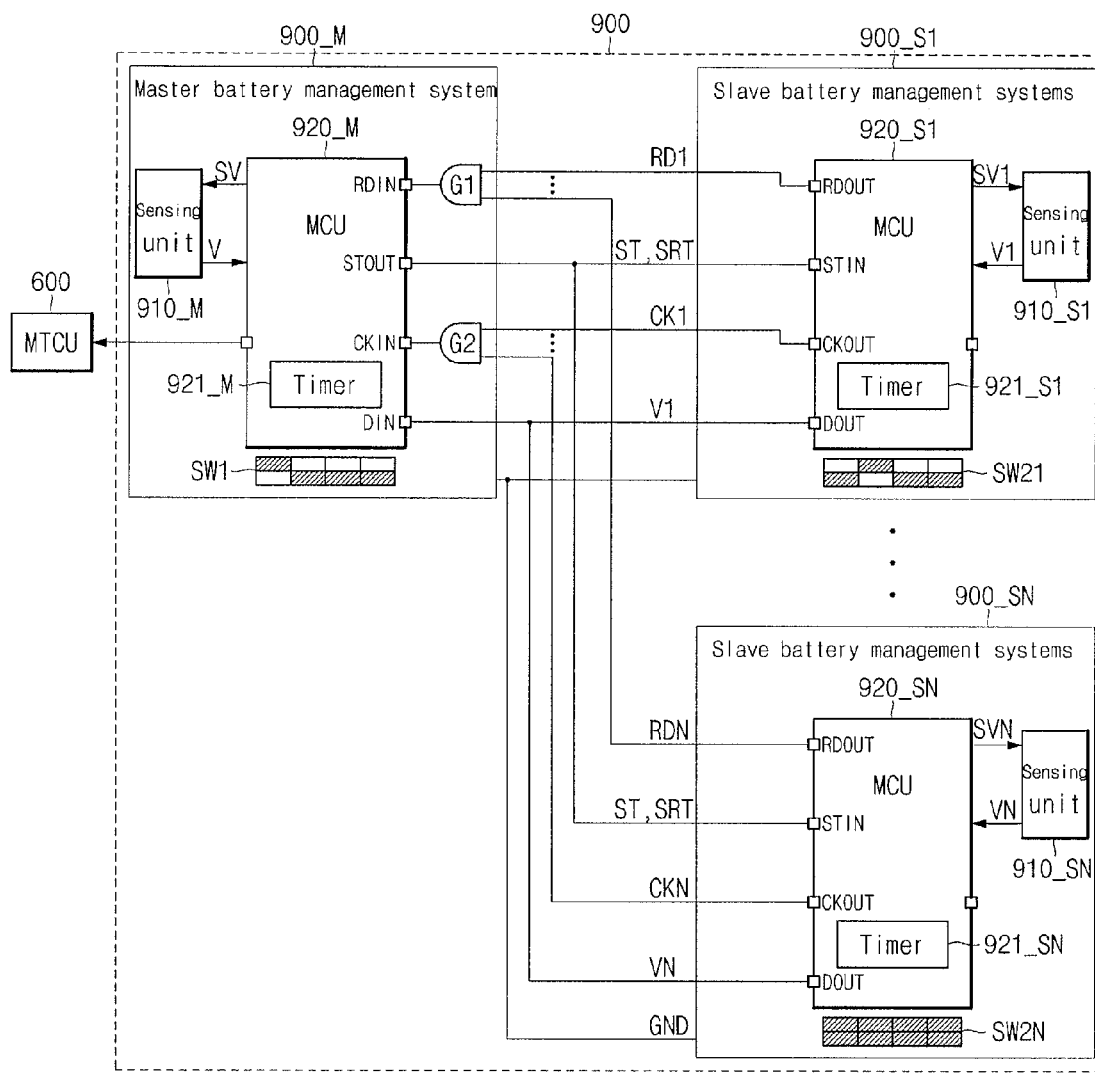
FIG. 3 is a schematic block diagram of a master battery management system and slave battery management systems of the battery management system according to one embodiment of the present invention.

FIG. 3 is a schematic block diagram illustrating the constitutions of the master battery management system 900_M and the slave battery management systems 900_S1 to 900_SN of the battery management system according to one embodiment of the present invention.

For ease of explanation, the MCU 920_M including a timer 921_M and the sensing unit 910_M of the master battery management system 900_M are illustrated in FIG. 3, and MCUs 920_S1 to 920_SN including timers 921_S1 to 921_SN, respectively, and sensing units 910_S1 to 910_SN of the slave battery management systems 900_S1 to 900_SN are illustrated in FIG. 3.

The sensing unit 910_M of the master battery management system 900_M measures the voltages (V) of the corresponding battery cells, the current (I) and temperature (T) of the battery, etc. The sensing units 910_S1 to 910_SN of the slave battery management systems 900_S1 to 900_SN measure the voltages (V) and temperatures (T) of the corresponding battery cells, etc. The cell voltages measured by the sensing unit 910_M is represented by V, and the cell voltages measured by the sensing units 910_S1 to 910_SN are represented by V1 to VN, respectively. SV designated in FIG. 3 refers to a voltage control signal outputted from the MCU 920_M to the sensing unit 910_M.

The master battery management system 900_M includes a switch SW1 in addition to the MCU 920_M having the timer 921_M included therein.

The MCU 920_M receives the ready signals RD1 to RDN transmitted from the respective slave battery management systems 900_S1 to 900_SN through a ready signal input terminal RDIN. The MCU 920_M generates the synchronization start signal ST in response to the ready signals RD1 to RDN and concurrently operates the timer 921_M. Further, the MCU 920_M outputs the synchronization start signal ST to all of the slave battery management systems 900_S1 to 900_SN through the synchronization signal output terminal STOUT. Further, the MCU 920_M periodically outputs the synchronization reset signal SRT to all of the slave battery management systems 900_S1 to 900_SN through the synchronization signal output terminal STOUT. This operation enables precise synchronization between the timers 921_S1 to 921_SN of the slave battery management systems 900_S1 to 900_SN and the timer 921_M of the master battery management system 900_M. That is, the timers 921_S1 to 921_SN of the slave battery management systems 900_S1 to 900_SN are independent from the timer 921_M of the master battery management system 900_M, but all of the timers 921_S1 to 921_SN are forcibly and periodically synchronized with the timer 921_M by software in response to the synchronization reset signal SRT.

The MCU 920_M receives information of the battery (e.g., the voltages V1 to VN of the battery cells) acquired in the slave battery management systems 900_S1 to 900_SN through a data input terminal DIN. Further, the MCU 920_M is synchronized to control the current sensor 200 and measure the current (I) of the battery at the time when the slave battery management systems 900_S1 to 900_SN measure the voltages V1 to VN of the battery cells. Further, the MCU 920_M estimates the SOC and SOH of the battery based on the acquired information of the battery.

Specifically, the MCU 920_M receives the ready signals RD1 to RDN inputted from the respective slave battery management systems 900_S1 to 900_SN. For this signal delivery, the ready signal input terminal RDIN of the MCU 920_M is connected to an output terminal of an AND gate G1 and a plurality of input terminals of the AND gate G1 are connected to the respective slave battery management systems 900_S1 to 900_SN. The AND gate G1 may be implemented in an integrated circuit (IC) chip, for example. This connection allows the MCU 920_M to receive and process the ready signals (RD1 to RDN) inputted from the respective slave battery management systems 900_S1 to 900_SN through one input terminal, i.e. the ready signal input terminal RDIN. Two or more ready signal input terminals RDIN may be used in one embodiment of the present invention. In other words, the master battery management system 900_M may receive the ready signals RD1 to RDN through ready signal input terminals RDIN corresponding to the respective slave battery management systems 900_S1 to 900_SN. When the active high-level ready signals RD1 to RDN are all inputted to the master battery management system 900_M through the ready signal input terminal RDIN, the MCU 920_M generates the synchronization start signal ST and concurrently operates the timer 921_M. Further, the MCU 920_M transmits the synchronization start signal ST to the slave battery management systems 900_S1 to 900_SN. Further, the MCU 920_M periodically transmits the synchronization reset signal SRT to the respective slave battery management systems 900_S1 to 900_SN through the synchronization signal output terminal STOUT.

The value of the switch SW1 can be set so as to be recognized as the master battery management system 900_M. The value of the switch SW1 may be varied depending on a user's setting.

As described above, the slave battery management systems 900_S1 to 900_SN include sensing units 910_S1 to 910_SN, MCUs 920_S1 to 920_SN for outputting the ready signals RD1 to RDN and acquiring information of the battery, independently operating timers 921_S1 to 921_SN, and switches SW21 to SW2N.

The MCUs 920_S1 to 920_SN respectively transmit the ready signals RD1 to RDN to the master battery management system 900_M through respective ready signal output terminals RDOUT, and receive the synchronization start signal ST and/or the synchronization reset signal SRT through synchronization signal input terminals STIN. The MCUs 920_S1 to 920_SN operate the respective timers 921_S1 to 921_SN when the synchronization start signal ST is inputted through the synchronization signal input terminals STIN and forcibly reset the timers 921_S1 to 921_SN to a reference time (e.g., predetermined time) when the synchronization reset signal SRT is inputted through the synchronization signal input terminals STIN. Accordingly, the timer 921_M of the master battery management system 900_M and the timers 921_S1 to 921_SN of the slave battery management systems 900_S1 to 900_SN operate in synchronization with each other even when external electrical noise is present. Hence, in one embodiment, the timers 921_M and 921_S to 921_SN are always synchronized with each other. The MCUs 920_S1 to 920_SN generate control signals, for example, voltage control signals SV1 to SVN, respectively, in synchronization with the synchronization start signal ST, and transmit the control signals to the sensing units 910_S1 to 910_SN, respectively, in order to measure information of the battery. The MCUs 920_S1 to 920_SN transmit the voltages V1 to VN of the battery cells measured in the sensing units 910_S1 to 910_SN to the MCU 920_M of the master battery management system 900_M through data output terminals DOUT.

The values of the switches SW21 to SW2N may be set so as to be recognized as the slave battery management systems 900_S1 to 900_SN. The values of the switches SW21 to SW2N may be varied depending on a user's setting. In one embodiment of the present invention, the master battery management system is distinguished from the slave battery management systems by the values of the switches SW1 and SW21 to SW2N. In an alternative embodiment, inherent identifiers (e.g., serial numbers) may be assigned to the battery management systems to distinguish the master battery management system from the slave battery management systems.

The slave battery management systems 900_S1 to 900_SN output the synchronization check signals CK1 to CKN through respective synchronization check signal output terminals CKOUT. The synchronization check signals CK1 to CKN may be the battery voltage control signals SV1 to SVN outputted from the MCUs 920_S1 to 920_SN. As a result, the master battery management system 900_M can determine whether or not the timers 921_S1 to 921_SN of the slave battery management systems 900_S1 to 900_SN are synchronized with the timer 921_M of the master battery management system 900_M through the synchronization check signals CK1 to CKN as the battery voltage control signals SV1 to SVN. Now, an explanation will be given of the battery voltage control signals SV1 to SVN.

Figure 4A:
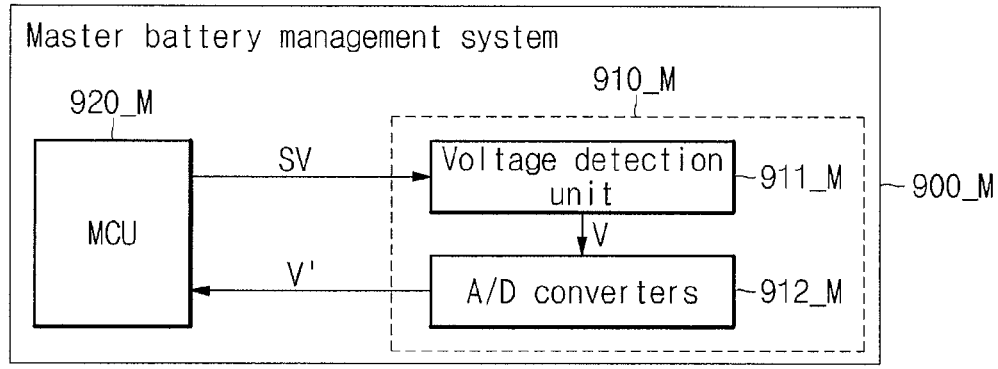
FIGS. 4A, 4B and 4C are detailed block diagrams of sensing units of the battery management system according to one embodiment of the present invention.
Figure 4B:
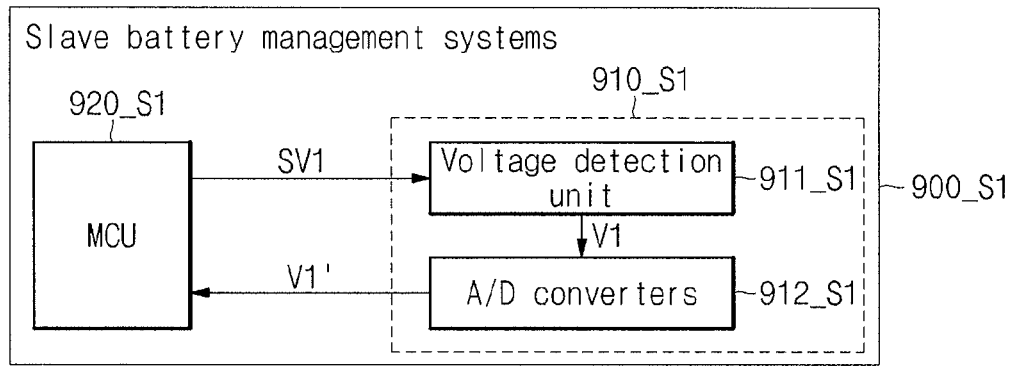
Figure 4C:
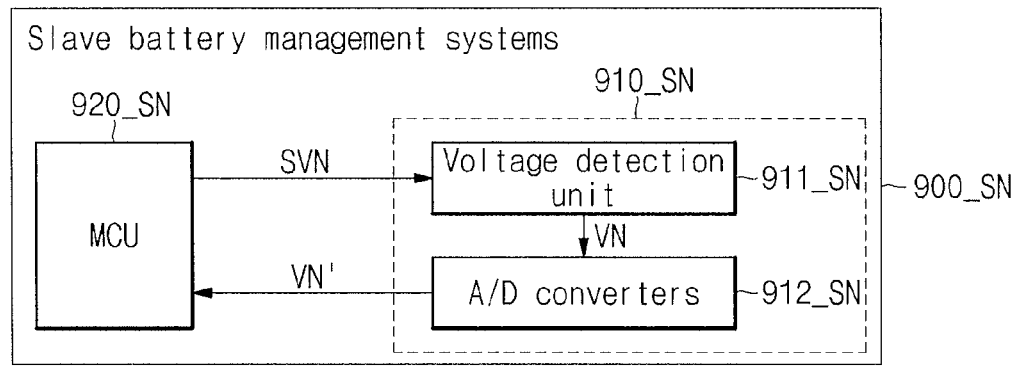

FIGS. 4A, 4B and 4C illustrate detailed block diagrams of the sensing units 910_M and 910_S1 to 910_SN of the battery management system according to one embodiment of the present invention.

As illustrated in FIGS. 4A-4C, the sensing units 910_M and 910_S1 to 910_SN measure information V, V1 to VN of the battery in response to the control signals SV, SV1 to SVN transmitted from the MCU 920_M and 920_S1 to 920_SN, and transmit the measured information to the MCUs 920_M and 920_S1 to 920_SN, respectively. The sensing units 910_M and 910_S1 to 910_SN include voltage detection units 911_M and 911_S1 to 911_SN and A/D converters 912_M and 912_S1 to 912_SN, respectively.

The sensing units 910_M and 910_S1 to 910_SN are operated in substantially the same manner. Herein, the sensing units 910_S1 to 910_SN will be exemplified in terms of their operation.

The voltage detection units 911_S1 to 911_SN receive the voltage control signals SV1 to SVN from the respective MCUs 920_S1 to 920_SN. The voltage detection units 911_S1 to 911_SN measure the voltages V1 to VN of the battery cells in response to the voltage control signals SV1 to SVN and transmit the measured voltages V1 to VN to the A/D converters 912_S1 to 912_SN, respectively.

The A/D converters 912_S1 to 912_SN convert the cell voltages V1 to VN, which are read as analog values into digital data V1' to VN' and transmit the digital data V1' to VN' to the MCU 920_S1 to 920_SN respectively.

Figure 5:
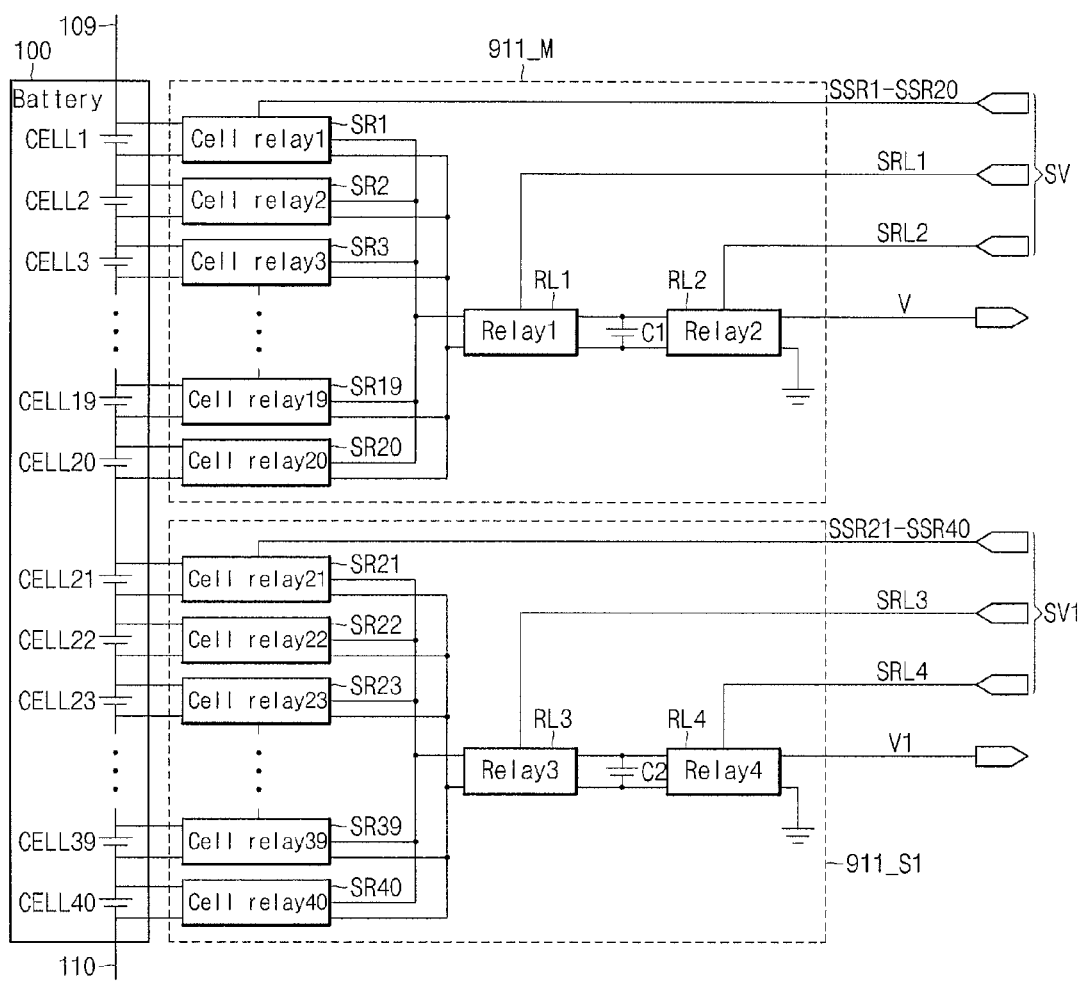
FIG. 5 is a detailed block diagram illustrating voltage detection units of the battery management system according to one embodiment of the present invention.

FIG. 5 is a detailed block diagram illustrating the voltage detection units 911_M and 911_S1 of the battery management system according to one embodiment of the present invention.

The constitution of the voltage detection unit 911_M of the sensing unit 910_M is the same (or substantially the same) as the constitutions of the voltage detection units 911_S1 to 911_SN of the sensing units 910_S1 to 910_SN. Herein, the voltage detection unit 911_S1 will be exemplified in terms of its constitution and operation.

As illustrated in FIG. 5, the voltage detection unit 911_S1 includes a plurality of cell relays SR21 to SR40, relays RL3 and RL4, and a capacitor C2. The voltage control signal SV1 transmitted to the voltage detection unit 911_S1 includes cell relay control signals SSR21 to SSR40 for controlling the respective cell relays SR21 to SR40 and relay control signals SRL3 and SRL4 for controlling the respective relays RL3 and RL4. The cell relays SR21 to SR40 are turned on when the respective cell relay control signals SSR21 to SSR40 are at a high level and are turned off when the respective cell relay control signals SSR21 to SSR40 are at a low level. The relays RL3 and RL4 are turned on when the respective relay control signals SRL3 and SRL4 are at a high level and are turned off when the respective relay control signals SRL3 and SRL4 are at a low level. In one embodiment of the present invention, the number of the cell relays SR1 to SR40 is limited to forty because forty battery cells are provided. However, the number of the cell relays may be varied according to the total number of the constituent battery cells of the battery. It is to be understood that the number of the slave battery management systems 900_S1 to 900_SN can also be varied according to the number of the constituent battery cells of the battery.

Each of the cell relays SR21 to SR40 is connected between a positive terminal and a negative terminal of a corresponding one of the cells CELL21 to CELL40 of the battery 100. The cell relays SR21 to SR40 are turned on or off, which is determined by the cell relay control signals SSR21 to SSR40, and delivers the voltages of the cells CELL21 to CELL40 to the relay RL3. Then, the relay RL3 is turned on or off, which is determined by the relay control signal SRL3, receives the voltages of the battery cells delivered from the cell relays SR21 to SR40, and stores the cell voltages in the capacitor C2. The cell relays SR21 to SR40 are turned on or off in response to the cell relay control signals SSR21 to SSR40, respectively. The voltage of one of the cells CELL21 to CELL40 corresponding to the turned-on one of the cell relays SR21 to SR40 is delivered to the capacitor C2 through the turned-on cell relay. The corresponding battery cell is electrically connected to the capacitor C2 through the cell relay turned on by the cell relay control signals SSR21 to SSR40 and the relay RL3 turned on by the relay control signal SRL3. This electrical connection allows the detected voltage of the battery cell to be stored in the capacitor C2 through the path including the turned-on cell relay and the relay RL3. A delay time (e.g., predetermined delay time) after the detected voltage is charged in the capacitor C2, the relay RL4 is turned on in response to the relay control signal SRL4 and delivers the voltage stored in the capacitor C2 to the A/D converter 912_S1.

As described above, the cell relay control signals SSR21 to SSR40 or the relay control signals SRL3 and SRL4 of the battery voltage control signals SV1 to SVN may be used as the synchronization check signals CK1 to CKN.

For example, when a cell relay control signal SSR1 of the master battery management system 900_M is inputted with the same phase as that of the cell relay control signal SSR21 of the slave battery management system 900_S1, it can be determined that the master battery management system 900_M is precisely synchronized with the slave battery management systems 900_S1 to 900_SN. However, when the cell relay control signals SSR1 and SSR21 do not have the same phase or at least one of the cell relay control signals SSR1 and SSR21 is not inputted, the master battery management system 900_M determines the system to be faulty.

Figure 6:
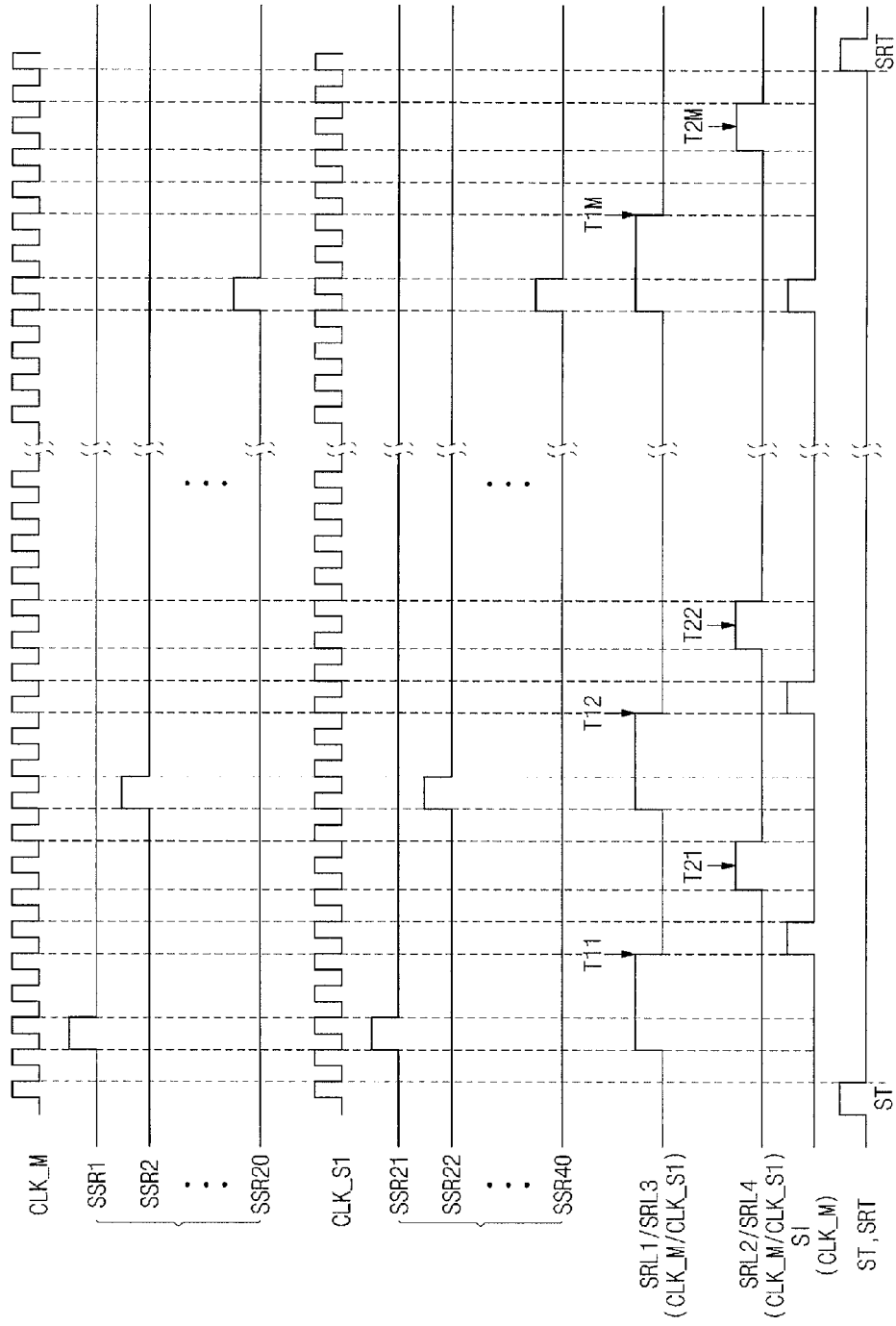
FIG. 6 is a waveform diagram of driving signals from the battery management system according to one embodiment of the present invention.

FIG. 6 is a waveform diagram of driving signals from the battery management system according to one embodiment of the present invention.

In the following description, it is assumed that the battery management system includes the master battery management system 900_M and the slave battery management system 900_S1. The master battery management system 900_M measures the voltages V of the battery cells stored in respective battery cells CELL1 to CELL20 while concurrently measuring the current (I) of the battery, and the slave battery management system 900_S1 measures the voltages (V1) of the battery cells stored in the respective battery cells CELL21 to CELL40.

Basically, the master battery management system 900_M operates in synchronization with a clock CLK_M from the timer 921_M included therein, and the slave battery management system 900_S1 operates in synchronization with a clock CLK_S1 from the timer 921_S1 included therein.

The MCU 920_M of the master battery management system 900_M receives the ready signal at an active high level from the slave battery management system 900_S1. At this time, the MCU 920_M determines from the high-level ready signal that the slave battery management system 900_S1 is powered on. Further, the MCU 920_M generates the synchronization start signal ST and concurrently operates the timer 921_M to output the clock CLK_M. The master battery management system 900_M measures the voltages V of the battery cells in synchronization with the clock CLK_M from the timer 921_M. The MCU 920_M also transmits the synchronization start signal ST to the MCU 920_S1 of the slave battery management system 900_S1. Then, the MCU 920_S1 of the slave battery management system 900_S1 operates the timer 921_S1 included therein to allow the clock CLK_S1 to be outputted. Further, the slave battery management system 900_S1 measures the voltages V1 of the battery cells in synchronization with the clock CLK_S1 from the timer 921_S1. At this time, the MCU 920_M of the master battery management system 900_M is synchronized to measure the current (I) of the battery at the time when the voltage V1 of the battery cell is measured in the slave battery management system 900_S1.

Specifically, the master battery management system 900_M creates the voltage control signal SV to measure the voltages of the battery cells CELL1 to CELL20 in synchronization with the clock CLK_M, and transmits the voltage control signal SV to the voltage detection unit 911_M of the sensing unit 910_M. Then, the voltage detection unit 911_M sequentially turns on the cell relays SR1 to SR20 and measures the voltage of the battery cell.

First, the cell voltage V of the battery stored in the battery cell CELL1 in the master battery management system 900_M is measured by the following procedure. The high-level cell relay control signal SSR1 is synchronized with the clock CLK_M and is transmitted to the cell relay SR1 of the voltage detection unit 911_M. When the high-level relay control signal SRL1 is synchronized with the clock CLK_M and is transmitted to the relay RL1, the cell voltage V of the battery stored in the battery cell CELL1 is stored in the capacitor C1 through the cell relay SR1 and the relay RL1.

A delay time (e.g., predetermined delay time) after the time T11 while the low-level relay control signal SRL1 for turning off the relay RL1 is transmitted, the MCU 920_M of the master battery management system 900_M transmits the high-level relay control signal SRL2 to the relay RL2 to turn on the relay RL2. At the time T21 when the relay RL2 is completely turned on, the voltage detection unit 911_M of the sensing unit 910_M measures the detected voltage corresponding to the cell voltage V of the battery stored in the capacitor C1 and transmits the detected voltage to the A/D converter 912_M. The ND converter 912_M converts the cell voltage V of the battery, which is read as an analog value, to digital data V' and transmits the digital data V' to the MCU 920_M.

Concurrently, the slave battery management system 900_S1 creates the voltage control signal SV1 to measure the voltages of the battery cells CELL21 to CELL40 in synchronization with the clock CLK_S1, and transmits the voltage control signal SV1 to the voltage detection unit 911_S1 of the sensing unit 910_S1. Then, the voltage detection unit 911_S1 sequentially turns on the cell relays SR21 to SR40 and measures the voltage of the battery cells.

First, the cell voltage V1 of the battery stored in the battery cell CELL21 in the slave battery management system 900_S1 is measured by the following procedure. The high-level cell relay control signal SSR21 is synchronized with the clock CLK_S1 and is transmitted to the cell relay SR21 of the voltage detection unit 911_S1. When the high-level relay control signal SRL3 is synchronized with the clock CLK_S1 and is transmitted to the relay RL3, the cell voltage V1 of the battery stored in the battery cell CELL21 is stored in the capacitor C2 through the cell relay SR21 and the relay RL3.

A delay time (e.g., predetermined delay time) after the time T11 while the low-level relay control signal SRL3 for turning off the relay RL3 is transmitted, the MCU 920_S1 of the slave battery management system 900_S1 transmits the high-level relay control signal SRL4 to the relay RL4 to turn on the relay RL4. At the time T21 when the relay RL4 is completely turned on, the voltage detection unit 911_S1 of the sensing unit 910_S1 measures the detected voltage corresponding to the cell voltage V1 of the battery stored in the capacitor C2 and transmits the detected voltage to the A/D converter 912_S1. The A/D converter 912_S1 converts the cell voltage V1 of the battery, which is read as an analog value, to digital data V1' and transmits the digital data V1' to the MCU 920_S1. Then, the MCU 920_S1 transmits the detected voltage corresponding to the converted cell voltage V1 of the battery to the MCU 920_M of the master battery management system 900_M.

At the time T11 when the voltages of the battery cells to be measured in the voltage detection units 911_M and 911_S1 are stored in the capacitors C1 and C2, respectively, the MCU 920_M of the master battery management system 900_M transmits a current control signal SI for controlling the current sensor 200 to measure the current (I) of the battery. At the time T11, the low-level relay control signals SRL1 and SRL3 are transmitted to the relays RL1 and RL3 to turn off the relays RL1 and RL3, respectively. The MCU 920_M estimates the SOC and SOH of the battery based on the current (I) of the battery and the cell voltages V and V1 of the battery.

Any one of the cell relay control signal SSR21, the relay control signal SRL3 and the relay control signal SRL4 included in the voltage control signal SV1 from the MCU 920_S1 of the slave battery management system 900_S1 is transmitted as the synchronization check signal CK1 to the master battery management system 900_M. Therefore, the master battery management system 900_M can confirm (or verify) whether or not the timer of the master battery management system 900_M is operated in synchronization with the timer of the slave battery management system 900_S1, based on the synchronization check signal CK1.

In accordance with the above order, the MCU 920_M of the master battery management system 900_M and the MCU 920_S1 of the slave battery management system 900_S1 sequentially measure the cell voltages V and V1 of the battery stored in the battery cells CELL1 to CELL20 and the battery cells CELL21 to CELL40 while they are synchronized with the clocks CLK_M and CLK_S1, respectively. That is, the cell voltage V of the battery stored in the battery cell CELL1 is measured in accordance with the clock CLK_M in the master battery management system 900_M, and concurrently the cell voltage V1 of the battery stored in the battery cell CELL21 is measured in accordance with the clock CLK_S1 in the slave battery management system 900_S1. In this manner, the master battery management system 900_M can sequentially measure the voltages of the battery cells CELL1 to CELL20 in accordance with the clock CLK_M, and concurrently the slave battery management system 900_S1 can sequentially measure the voltages of the battery cells CELL21 to CELL40 in accordance with the clock CLK_S1.

After the voltage V of the battery cells CELL1 to CELL20, the voltage V1 of the battery cells CELL21 to CELL40 and the current (I) of the battery are measured, the timer 921_S1 included in the slave battery management system 900_S1 is synchronized with the timer 921_M included in the master battery management system 900_M. In more detail, the synchronization reset signal SRT is outputted from the master battery management system 900_M to the slave battery management system 900_S1 during periods without the voltage control signals SSR1 to SSR20, SSR21 to SSR40, SRL1, SRL3, SRL2, SRL4, etc. This operation will be described below.

Figure 7:
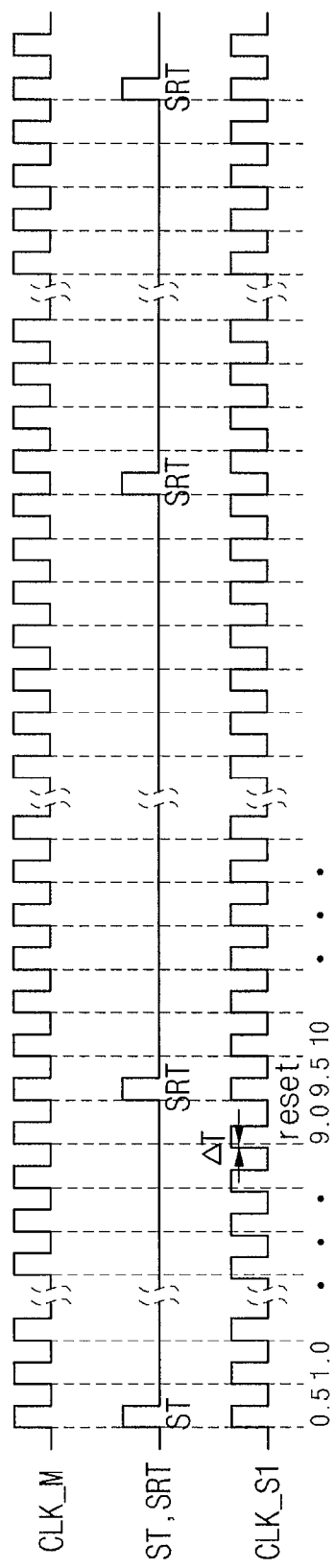
FIG. 7 is a waveform diagram of a synchronization reset signal periodically transmitted from a master battery management system to a slave battery management system from among the waveforms of driving signals from the battery management system according to one embodiment of the present invention.

FIG. 7 is a waveform diagram of the synchronization reset signal periodically transmitted from the master battery management system 900_M to the slave battery management system 900_S1 in the waveforms of driving signals from the battery management system according to one embodiment of the present invention.

As illustrated in FIG. 7, the master battery management system 900_M outputs the clock CLK_M using the timer 921_M included therein and the slave battery management system 900_S1 also outputs the clock CLK_S1 using the timer 921_S1 included therein. The two clocks CLK_M and CLK_S1 start at the same point due to the synchronization start signal ST but may be changed to have different frequencies and/or phases due to external factors, e.g., noise, with the passage of time.

To solve this problem, after the voltages of the battery cells and the current of the battery are measured, the master battery management system 900_M outputs the synchronization reset signal SRT to the slave battery management system 900_S1. As a result, the timer 921_S1 included in the slave battery management system 900_S1 is reset to a particular time, i.e. the same reference time as the timer 921_M included in the master battery management system 900_M. Thus, the timer 921_M of the master battery management system 900_M and the timer(s) 921_S1 of the slave battery management system 900_S1 will have the same clock frequency and phase. FIG. 7 illustrates that the clock CLK_S1 of the slave battery management system 900_S1 may be delayed by ΔT due to external noise with the lapse of time. The synchronization reset signal SRT can remove the ΔT to synchronize the clock CLK_S1 of the slave battery management system 900_S1 with the clock CLK_M of the master battery management system 900_M. Even when the clock CLK_M of the master battery management system 900_M is delayed by external noise, the two clocks CLK_M and CLK_S1 are synchronized with each other by matching the phases of the clock CLK_S1 of the slave battery management system 900_S1 and the delayed clock CLK_M.

This operation will be explained in more detail on the assumption that the timers of the master battery management system 900_M and the slave battery management system 900_S1 are 500 μs timers, the voltage and current detection cycles of all battery cells are approximately 10 ms, and the voltages and currents of all battery cells are detected at approximately 9 ms.

The master battery management system 900_M outputs the synchronization reset signal SRT to the slave battery management system 900_S1 at about 9.5 ms without any voltage control signals. As a result, the clock CLK_S1 of the slave battery management system 900_S1 is forcibly adjusted to 9.5 ms. The respective timers of the master battery management system 900_M and the slave battery management system 900_S1 are all synchronized at 9.5 ms.

According to one embodiment of the present invention, the synchronization times of the plurality of battery management systems are matched in a periodic and forcible manner, so that the validity and reliability of the measured values and calculated values can be improved. In addition, problems, such as time delay, which may arise when external noise is not completely prevented by hardware, can be addressed and solved by software.

Figure 8:
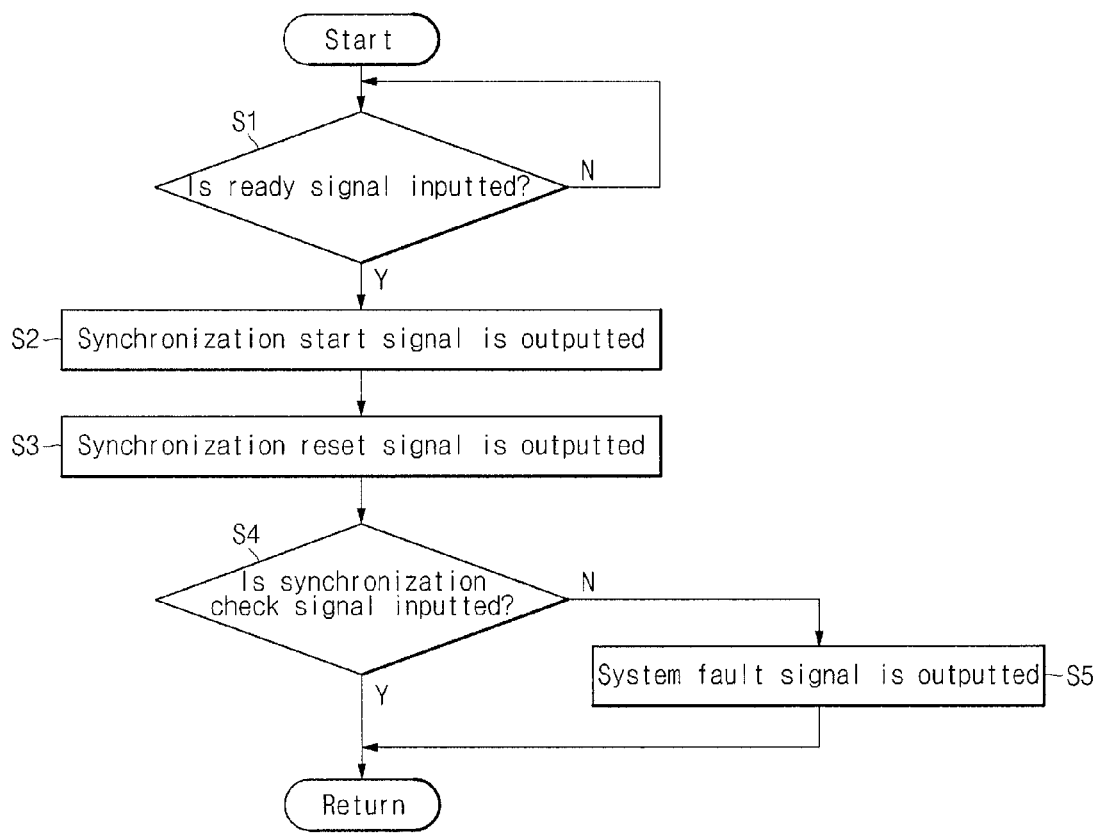
FIG. 8 is a flow chart illustrating a method for driving a battery management system according to another embodiment of the present invention.

FIG. 8 is a flow chart illustrating a method for driving a battery management system according to another embodiment of the present invention.

As described above, the battery management system includes a master battery management system and at least one slave battery management system. A driving method of the master battery management system according to another embodiment will be primarily explained below. Unless otherwise stated, all operations are done by the master battery management system in the below description. All reference numerals are omitted because an explanation relating to the method is given.

The method according to another embodiment of the present invention includes the following steps: determination of a ready signal (S1); outputting of a synchronization start signal (S2); outputting of a synchronization reset signal (S3); determination of a synchronization check signal (S4); and outputting of a system fault signal (S5).

In step S1, it is determined whether a ready signal is inputted from the slave battery management system. The slave battery management system outputs the ready signal to the master battery management system when the internal power is on.

In step S2, a synchronization start signal is outputted to the slave battery management system. The master battery management system operates its internal timer while also (e.g., concurrently) outputting the synchronization start signal. The slave battery management system also operates their respective internal timers in response to the synchronization start signal. It is to be understood that clock frequencies outputted from the timers of the master battery management system and the slave battery management system have the same value. Further, the two clock frequencies start at the same point (i.e., the clocks have the same phase).

In step S3, a synchronization reset signal is outputted to the slave battery management system. In operation, the master battery management system periodically outputs the synchronization reset signal.

The clock of the timer included in the slave battery management system is forcibly reset to a reference time (e.g., predetermined time) in response to the synchronization reset signal. The reference time (e.g., the predetermined time) as used herein refers to the time at which the clock frequencies of the timers of the master battery management system and the slave battery management system have the same phase. For example, when the clock of the timer of the master battery management system starts at 9.5 ms, the clock of the timer of the slave battery management system also starts at 9.5 ms, which may be adjusted by forced holding or dragging. Step S3 is carried out at the time when no sensing operation is performed in order to avoid disturbance to the voltage, current and temperature sensing of the battery cells.

In step S4, it is determined whether a synchronization check signal is inputted from the slave battery management system. The synchronization check signal may be selected from battery voltage control signals for detecting the battery voltage. That is, the synchronization check signal may be one of the voltage control signals outputted from the slave battery management system to detect the voltage of the corresponding battery cell. When the synchronization check signal is inputted from the slave battery management system and has the same phase as a voltage control signal outputted from the master battery management system, it can be determined that the master battery management system is precisely synchronized with the slave battery management system.

In step S5, a system fault signal is outputted when the synchronization check signal is not inputted from the slave battery management system or the inputted synchronization check signal has a phase different from that of the voltage control signal outputted from the master battery management system. For example, the system fault signal may be transmitted to the MTCU of the vehicle or may be directly outputted on a display to inform a user of the fault.

According to one embodiment of the present invention, the synchronization reset signal is periodically outputted from the master battery management system to the slave battery management system to forcibly match the synchronization time of the master battery management system and the synchronization time of the slave battery management system. Therefore, the validity and reliability of the measured values, such as the voltage, current and temperature values of the battery cell, and the calculated values therefrom are improved. In addition, the time delay of the timers is prevented or reduced by software as well as hardware, thus ensuring better performance of the battery management system. Hence, the master battery management system and the slave battery management system precisely synchronize synchronization signals by software as well as hardware.

Although certain exemplary embodiments of the present invention have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A battery management system for managing a battery comprising a plurality of battery cells, the battery management system comprising:
   a plurality of master/slave battery management systems, each of the master/slave battery management systems comprising a voltage detection unit for measuring a voltage of a corresponding one or more of the battery cells, wherein the plurality of master/slave battery management systems comprises:
      at least one slave battery management system for outputting a ready signal when power is applied thereto; and
      a master battery management system for providing a synchronization start signal to the at least one slave battery management system in response to the ready signal,
      wherein the master battery management system is configured to periodically provide a synchronization reset signal to the at least one slave battery management system.

2. The battery management system of claim 1, wherein the master battery management system comprises an internal timer that is operated in response to the ready signal.

3. The battery management system of claim 1, wherein the master battery management system comprises an AND gate configured to receive the ready signal.

4. The battery management system of claim 1, wherein the at least one slave battery management system each comprises an internal timer that is operated in response to the synchronization start signal.

5. The battery management system of claim 1, wherein the at least one slave battery management system each comprises an internal timer that is reset to a reference time in response to the synchronization reset signal.

6. The battery management system of claim 1, wherein each slave battery management system of the at least one slave battery management system is configured to provide a synchronization check signal to the master battery management system in response to the synchronization start signal or the synchronization reset signal.

7. The battery management system of claim 6, wherein the synchronization check signal comprises a battery voltage control signal used for measuring a voltage of the corresponding one or more of the battery cells coupled to the slave battery management system.

8. The battery management system of claim 6, wherein the master battery management system is configured to output a system fault signal when the synchronization check signal is not received.

9. The battery management system of claim 6, wherein the master battery management system comprises an AND gate configured to receive the synchronization check signal.

10. A method for driving a battery management system for managing a battery comprising a plurality of battery cells, the battery management system comprising a plurality of master/slave battery management systems, each of the master/slave battery management systems comprising a voltage detection unit for measuring a voltage of a corresponding one or more of the battery cells, the plurality of master/slave battery management systems comprising a master battery management system and at least one slave battery management system, the method comprising:

assigning the corresponding one or more of the battery cells to each of the master battery management system and the at least one slave battery management system;

determining whether the master battery management system receives a ready signal from the at least one slave battery management system;

providing a synchronization start signal from the master battery management system to the at least one slave battery management system in response to the ready signal; and periodically providing a synchronization reset signal from the master battery management system to the at least one slave battery management system.

11. The method of claim 10, wherein the master battery management system comprises an internal timer and operates the internal timer when outputting the synchronization start signal.

12. The method of claim 10, wherein the master battery management system provides the synchronization start signal in response to the ready signal from each of the at least one slave battery management system.

13. The method of claim 10, wherein the at least one slave battery management system each comprises an internal timer, and operates the internal timer in response to the synchronization start signal.

14. The method of claim 10, wherein the at least one slave battery management system each comprises an internal timer and forcibly resets the internal timer to a reference time in response to the synchronization reset signal.

15. The method of claim 10, further comprising determining whether a synchronization check signal is received from each slave battery management system of the at least one slave battery management system after providing the synchronization start signal or the synchronization reset signal.

16. The method of claim 15, wherein the synchronization check signal comprises a battery voltage control signal used for measuring a voltage of the corresponding one or more of the battery cells coupled to the slave battery management system.

17. The method of claim 15, further comprising outputting a system fault signal from the master battery management system when the synchronization check signal is not received from the at least one slave battery management system.

* * * * *